US009052372B2

(12) United States Patent
Palma et al.

(10) Patent No.: US 9,052,372 B2
(45) Date of Patent: Jun. 9, 2015

(54) METHOD OF GENERATING 2D OR 3D MAPS OF MRI $T_1$ AND $T2_2$ RELAXATION TIMES

(75) Inventors: Guiseppe Palma, Calimera (IT); Danilo Greco, Genoa (IT); Stefania Innocenti, Genoa (IT); Bruno Alfano, Naples (IT)

(73) Assignees: ESAOTE S.P.A., Genoa (IT); CONSIGLIO NAZIONALE DELLE RICERCHE, Rome (IT)

( * ) Notice: Subject to any disclaimer, the term of this patent is extended or adjusted under 35 U.S.C. 154(b) by 604 days.

(21) Appl. No.: 13/409,953

(22) Filed: Mar. 1, 2012

(65) Prior Publication Data

US 2012/0223710 A1    Sep. 6, 2012

(30) Foreign Application Priority Data

Mar. 3, 2011    (IT) ................ GE2011A0024

(51) Int. Cl.
  *G01R 33/50* (2006.01)
  *G01R 33/44* (2006.01)

(52) U.S. Cl.
  CPC ............. *G01R 33/50* (2013.01); *G01R 33/448* (2013.01)

(58) Field of Classification Search
  CPC ........ G01R 33/50; G01R 33/54; G01R 33/56; G01R 33/081; G01R 33/448
  See application file for complete search history.

(56) References Cited

U.S. PATENT DOCUMENTS

| | | | | |
|---|---|---|---|---|
| 4,115,730 A * | 9/1978 | Mansfield | ..................... | 324/309 |
| 4,799,015 A * | 1/1989 | Sepponen | ..................... | 324/314 |
| 6,239,597 B1 * | 5/2001 | McKinnon | ..................... | 324/307 |
| 7,170,290 B2 * | 1/2007 | Miyoshi | ..................... | 324/309 |
| 7,622,919 B2 * | 11/2009 | Song et al. | ..................... | 324/307 |
| 7,852,077 B2 * | 12/2010 | Song et al. | ..................... | 324/309 |
| 7,863,895 B2 * | 1/2011 | Ma | ..................... | 324/309 |
| 8,115,482 B2 * | 2/2012 | Hughes | ..................... | 324/309 |
| 8,314,618 B2 * | 11/2012 | Bieri et al. | ..................... | 324/309 |
| 8,497,680 B2 * | 7/2013 | Bieri et al. | ..................... | 324/309 |
| 8,526,695 B2 * | 9/2013 | Witschey et al. | ..................... | 382/131 |
| 8,655,038 B2 * | 2/2014 | Keereman et al. | ..................... | 382/131 |
| 8,706,188 B2 * | 4/2014 | Koo et al. | ..................... | 600/410 |
| 8,781,197 B2 * | 7/2014 | Wang et al. | ..................... | 382/131 |
| 2008/0197841 A1 | 8/2008 | Fleysher | | |

OTHER PUBLICATIONS

G.H.Welsch et al.: "Rapid Estimation of Cartilage T2 Based on Double Echo at Steady State (DESS) With 3 Tesla", Magnetic Resonance in Medicine, vol. 62, 2009, pp. 544-549.
K.Scheffler et al.: "Ti Quantification With Inversion Recovery TrueFISP", Magnetic Resonance in Medicine, vol. 45, 2001, pp. 720-723.
C.Koay et al.: "An Optimal Framework for Ti Estimation in an SPGR Acquisition", Proc.Intl.Soc.Mag.Reson.Med. 15, 2007, p. 1794.
H.Z.Wang et al.: "Optimizing the Precision in Ti Relaxation Estimation Using Limited Flip Angles", Magnetic Resonance in Medicine, vol. 5, 1987, pp. 399-416.
S.C.L.Deoni et al.: "Rapid Combined Ti and T2 Mapping Using Gradient Recalled Acquisition in the Steady State", Magnetic Resonance in Medicine, vol. 49, 2003, pp. 515-526.

* cited by examiner

*Primary Examiner* — Dixomara Vargas
(74) *Attorney, Agent, or Firm* — Themis Law

(57) ABSTRACT

A method of generating 2D or 3D maps of MRI $T_1$ and $T_2$ relaxation times by acquiring 2D or 3D MRI gradient-echo images and extracting the $T_1$ and $T_2$ values from the images, wherein MRI images are acquired using a combination of gradient-echo sequences, including a first MRI image acquired using a SSFP-FID (Steady State Free Precession-Free Induction Decay) acquisition sequence; two further images acquired using a Dual-Echo SSFP acquisition sequence; and the $T_1$ and $T_2$ values are extracted for each image pixel or voxel from the corresponding MRI signals.

10 Claims, 4 Drawing Sheets

Fig. 3 - Combined histogram of relaxation rates for a knee at 0.25 T

METHOD OF GENERATING 2D OR 3D MAPS OF MRI $T_1$ AND $T2_2$ RELAXATION TIMES

FIELD OF THE INVENTION

The present invention relates to a method for generating 2D or 3D maps of MRI $T_1$ and $T_2$ relaxation times by acquiring 2D or 3D MRI gradient-echo images and extracting the $T_1$ and $T_2$ values from said images.

BACKGROUND OF THE INVENTION

The terms 2D and 3D designate images of two-dimensional and three-dimensional maps respectively, as is generally used in the field of diagnostic magnetic resonance imaging (MRI).

In the field of MRI, relaxation time mapping is a useful imaging instrument which is profitably used in the diagnosis of diseases affecting a variety of anatomic regions, from brain to limbs.

At present, the most advanced protocol for 3D $T_1$ and $T_2$ relaxometry involves the acquisition of 4 sequences (Deoni et al. US2005/0256393). Such great number of acquisitions has two apparent drawbacks, which might affect the quality of results and have an impact on everyday clinical practice: on the one hand the long duration of the protocol; on the other hand the considerable risk that any inadvertent movement of the patient might affect the quality of the individual images and perfect registration of different series (which is essential during combined post-processing of contrasts).

Document "T1 Quantification With Inversion Recovery TrueFISP," by Klaus Scheffler and Juergen Henning, Magnetic Resonance in Medicine, 45:720-723 (2001) discloses the use of a True FISP sequence for determining $T_1$ maps. TrueFISP sequences are subjected to a series of artefacts, the most relevant of which is the so called "banding artefact". This artefact is generated by the modulation of the signal in bands in as a consequence of varying homogeneity of the field. This particular artefact is clearly disclosed in the above mentioned document and particularly in FIG. 5 at page 722. From the disclosure of this document it appears clearly that the intensity profile of the $T_1$ map due to the above artefacts may be subject to intensity modulation of about 100% of the mean value.

Thus using a TrueFISP sequence for determining $T_1$ maps cannot lead to a sufficient quality of the said quantisation.

Document "Rapid estimation of Cartilage T2 Based on Double Echo at Steady State (DESS) With 3 Tesla" by Goetz H. Welsch et al, Magnetic Resonance in Medicine, 62:544-549 (2009) discloses the use of a DESS sequence for estimating $T_2$ maps.

Document US2008/197841, discloses a system for determining exemplary values for acquisition parameters for a given imaging time by using signals caused each by one of two different excitation sequences one of which is specified to be a double spin echo sequence. The double spin echo sequence has nothing in common with a DESS sequence. In particular the Double Spin Echo sequence necessitates of an acquisition geometry and of acquisition times which are completely different from the ones of the steady state sequences. In addition it would be very difficult to integrate a Double Spin echo sequence with a steady state sequence for mapping $T_1$ and $T_2$ because the signals acquired with the steady state sequence are dependent from $T_2^*$ while the signals acquired with the double spin echo sequence do not show this dependence.

None of the methods disclosed in the above mentioned documents tries to take into account the bias effects and systematic errors introduced in the relaxometry by the SS contrastdependence on the $T_2^*$. The $T_2^*$ relaxation time has a different behaviour as the $T_2$. Not considering the influence of the $T_2^*$ lead to artefacts and errors in the determination of the mapping of the relaxation times.

SUMMARY OF THE INVENTION

In view of obviating these weaknesses, a method is disclosed herein for acquiring and processing steady-state 2D or 3D MRI sequences, which provides proton density maps, $T_1$, $T_2$ and $T_{2p}$ from two acquisitions only.

The invention achieves the above purposes by providing a method as described above, in which MRI images are acquired using a combination of gradient-echo sequences, including:
a first MRI image acquired using a SSFP-FID (Steady State Free Precession-Free Induction Decay) acquisition sequence;
two further images acquired using a Dual-Echo SSFP acquisition sequence.

The $T_1$ and $T_2$ values are extracted for each image pixel or voxel from the corresponding MRI signals.

SSFT-FID and dual-echo SSFP sequences are known and widely used and are described in greater detail in Sobol W T & Gauntt D M, "On the Stationary States in Gradient Echo Imaging," J. Magn. Reson. Imaging, 1996; 6:384-398; Hänicke W & Vogel H U "An Analytical Solution for the SSFP Signal in MRI," Magn. Reson. Med., 2003; 49:771-775; Bruder H, Fischer H, Graumann, R & Deimling M, "A New Steady-State Imaging Sequence for Simultaneous Acquisition of Two MR Images with Clearly Different Contrasts," Magn. Reson. Med. 1988; 7:35-42.

$T_2$ and $T_1$ maps are obtained assuming that the only physical parameters that affect signal formation are pure longitudinal ($T_1$) and transverse ($T_2$) relaxation times, Free Induction Decay time ($T_2^*$) and proton density. Therefore, diffusion, perfusion, chemical shift, magnetization transfer and other parameters that may possibly independently affect contrast are neglected.

Also, single-exponential relaxation is assumed for the longitudinal and transverse components of the magnetic moment associated with each voxel: inherent multi-exponential relaxation (on a microscopic scale) and Partial Volume effects, known as PVE (on a macroscopic scale) will generally generate artifacts upon reconstruction.

According to an improvement, the above method acquires the 0-order unbalanced steady-state coherent magnetization of the first SSFP-FID sequence and 0 and (−1) order magnetization for the two images of the dual echo SSFP sequence respectively.

Namely, the method of the present invention allows determination of $T_1$ and $T_2$ values for each pixel or voxel from the MRI signals received in the acquisition of said images, through the steps of:
eliminating the dependence on the $T_2^*$ parameter by generating the quotients of the MRI signals for the first image acquired using the SSFP-FID sequence and those for the second image obtained from the first echoes of the dual-echo SSFP sequence, and the quotients of the signals for said third image and those for said second image, acquired from the second and first echoes of the dual-echo SSFP sequence respectively;
determining the maps of $T_1$ and $T_2$ relaxation times from the equations of the previous step using numerical inversion methods.

In principle, known inversion methods may be used, such as the one known as Newton-Raphson 2D method and others, as well as different methods that are specially developed and optimized for this numerical problem.

Particularly, a method that is specially developed for this problem is the one known as simplex-based interpolation, which will be described in greater detail below.

According to a further improvement, the method of the present invention determines the proton density map according to the maps of calculated $T_1$ and $T_2$ relaxation times.

Furthermore, the method determines the map of $T_{2p}$ parameters according to the values of the $T_1$ and $T_2$ relaxation time maps.

Advantageously, the invention provides optimization of acquisition parameters. Such optimization is carried out empirically, by making a chart with the actual distributions of relaxation times in a predetermined region under examination;

determining the numerical average signal-to-noise ratio value from the maps of $T_1$ and $T_2$ relaxation times so reconstructed as a function of the variations of acquisition parameters for various flip angles, repetition times and sampling band widths;

maximizing the signal-to-noise ratio and using the parameters related thereto.

As a further improvement, a step is provided for correction of signal-to-noise ratio according to the number of additional excitations exceeding those of a sequence having shorter repetition times.

Further improvements will form the subject of the dependent claims.

BRIEF DESCRIPTION OF THE DRAWINGS

The characteristics of the present method and the advantages of the present method will appear more clearly from the following description of a few non limiting embodiments, illustrated in the annexed drawings, in which.

DETAILED DESCRIPTION OF EMBODIMENTS OF THE INVENTION

Referring to a method according to the present invention, the $T_1$ and $T_2$ maps are obtained by acquiring 2D or 3D MRI signals using two sequences only.

The sequences that are used to generate relaxometry maps are steady-state 3D gradient-echo sequences. This will combine the typical advantages of 3D imaging sequences, i.e. speed, resolution and signal-to-noise ratio SNR with simple calibration of the system, which is a feature of the relaxometry method as disclosed herein.

The first of the two sequences that are used in the method of the present invention is a so-called SSFP-FID sequence (see references above).

Figure 1:
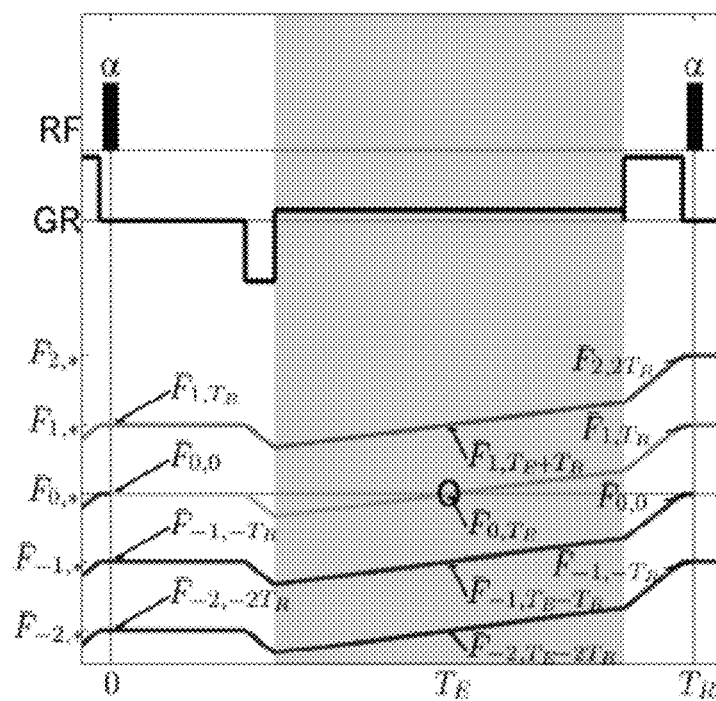
FIG. 1 is a diagram of the first SSFP-FID acquisition sequence. The diagram shows RF excitation pulses, referenced RF, the readout gradient, referenced GR and the various magnetization orders. The horizontal x-axis indicates time. The circles designate the time of acquisition of the center-of-the-echo signal, which is useful for the method of the invention.
Figure 2:
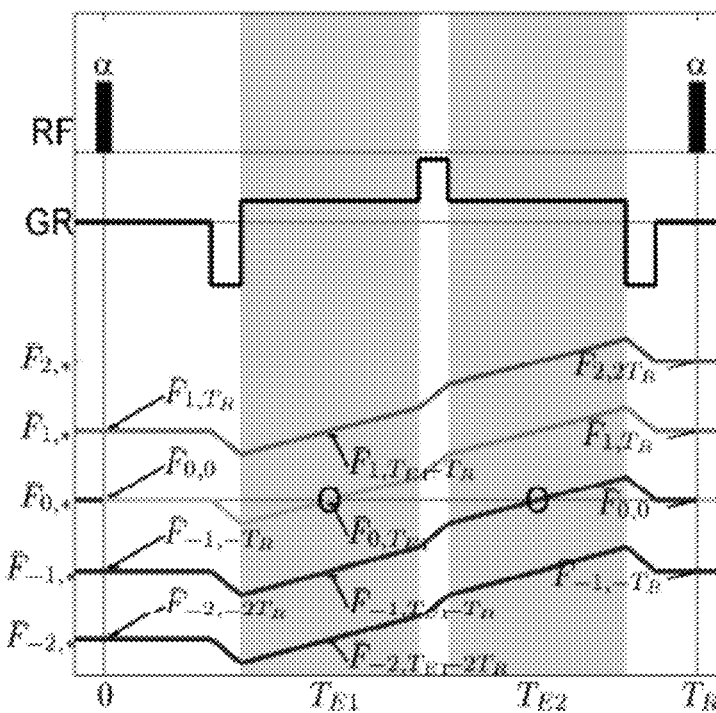
FIG. 2 is a diagram of the second dual-echo SSFP acquisition sequence. The structure of the diagram is the same as in FIG. 1 and, since the 0- and −1-order magnetization signal is considered here, the circles indicate the readout times for the central signals of corresponding echoes.

Assuming a SSFP-FID sequence (Steady-State Free-Precession Free Induction Decay—FIG. 1) with a repetition time $T_{R1}$, an echo time $T_{E0}$ and a flip angle $\alpha$, the equation that describes the signal corresponding to 0-order unbalanced steady-state coherent magnetization is (Sobol W T & Gauntt D M, "On the Stationary States in Gradient Echo Imaging," J. Magn. Reson. Imaging 1996; 6:384-398; Hänicke W & Vogel H U, "An Analytical Solution for the SSFP Signal in MRI," Magn Reson Med 2003; 49:771-775):

$$S_0(T_R, \alpha, T_E) = \qquad (1)$$
$$M_0 \sin\alpha \cdot \frac{1 - E_1(T_R)}{p(T_R, \alpha)} \cdot [u_0(T_R, \alpha) - E_2(T_R) \cdot u_1(T_R, \alpha)] \cdot e^{-T_E/T_2^*},$$

where $$E_1(T_R) = \exp(-T_R/T_1), \qquad (2)$$

$$E_2(T_R) = \exp(-T_R/T_2), \qquad (3)$$

$$u_0(T_R, \alpha) = \frac{p(T_R, \alpha)}{\sqrt{p^2(T_R, \alpha) - q^2(T_R, \alpha)}}, \qquad (4)$$

$$u_1(T_R, \alpha) = \frac{p(T_R, \alpha)}{q(T_R, \alpha)} \cdot [u_0(T_R, \alpha) - 1], \qquad (5)$$

$$p(T_R, \alpha) = 1 - E_1(T_R) \cdot \cos\alpha - E_2^2(T_R) \cdot [E_1(T_R) - \cos\alpha] \qquad (6)$$

e $$q(T_R, \alpha) = E_2(T_R) \cdot [1 - E_1(T_R)] \cdot [1 + \cos\alpha]. \qquad (7)$$

where $T_R$ is the repetition time and $T_E$ is the echo time, whereas $\alpha$ is the so-called flip angle.

The second sequence is a dual-echo SSFP sequence (Bruder H, Fischer H, Graumann R & Deimling M, "A New Steady-State Imaging Sequence for Simultaneous Acquisition of Two MR Images with Clearly Different Contrasts," Magn. Reson. Med. 1988; 7:35-42) and allows separate acquisition of 0 (at time $T_{E1}$) and −1 (at time $T_E2$) order unbalanced steady-state coherent magnetization in a single $T_R$. The equation for the 0-order signal coincides with the equation designated as Eq. 1 for the SSFP-FID sequence, whereas the −1-order sequence is given by (Sobol & Gauntt 1996; Hänicke & Vogel 2003):

$$S_{-1}(T_R, \alpha, T_E) = \tag{8}$$

$$M_0 \sin\alpha \cdot \frac{1 - E_1(T_R)}{p(T_R, \alpha)} \cdot \left[ \frac{u_1(T_R, \alpha)}{E_2(T_R)} - u_0(T_R, \alpha) \right] \cdot e^{-(T_R - T_{E2})/T_2^*}.$$

A comparison of the equations for the 3 acquired signals (Eqs. 1 and 8) shows that factorization of spurious dependence on $T_2^*$ requires $T_{E0} = T_{E1} = T_{R2} - T_{E2}$.

The $T_1$ and $T_2$ maps are obtained as follows:

Assume that $I_1$, $I_2$ and $I_3$ are the images reconstructed from SSFP-FID, the first and second echoes of the Dual-Echo SSFP, respectively.

Assume the derived images $$D_1 = I_1/I_2 \tag{9}$$

$$D_2 = I_3/I_2 \tag{10}$$

whose signal equations are:

$$S_1 = \frac{\sin\alpha_1 \cdot \frac{1 - E_1(T_{R1})}{p(T_{R1}, \alpha_1)} \cdot [u_0(T_{R1}, \alpha_1) - E_2(T_{R1}) \cdot u_1(T_{R1}, \alpha_1)]}{\sin\alpha_2 \cdot \frac{1 - E_1(T_{R2})}{p(T_{R2}, \alpha_2)} \cdot [u_0(T_{R2}, \alpha_2) - E_2(T_{R2}) \cdot u_1(T_{R2}, \alpha_2)]} \tag{11}$$

$$S_2 = \frac{\frac{u_1(T_{R2}, \alpha_2)}{E_2(T_{R2})} - u_0(T_{R2}, \alpha_2)}{u_0(T_{R2}, \alpha_2) - E_2(T_{R2}) \cdot u_1(T_{R2}, \alpha_2)}. \tag{12}$$

It will be appreciated that Eqs. 11 and 12 show no dependence on $T_2^*$ and longitudinal equilibrium magnetization M0:except the dependence on acquisition parameters, the signals of the 2 derived images only depend on $T_1$ and $T_2$.

Therefore, Eqs. 11 and 12 may be inversed to determine, voxel by voxel (or pixel by pixel), pure relaxation times in the region being imaged.

In principle, any method for (numerical) inversion of a non-linear system of 2 equations in 2 unknowns may be used.

In order to prove that any inversion method is effective, two different methods will be described herein, i.e. a first method that uses a known algorithm and a second method that has been specially developed for this kind of problem.

The first method is the so-called Newton-Raphson 2D method (Press W H, Teukolsky S A, Vetterling W T & Flannery B P, "Numerical Recipes, The Art of Scientific Computing," Third Edition, Cambridge University Press, New York (2008)).

$$G_i(T_1, T_2) \equiv S_i(T_1, T_2) - D_i = 0 \quad i = 1, 2, \tag{13}$$

then $$T \equiv \begin{bmatrix} T_1 \\ T_2 \end{bmatrix} \tag{14}$$

may be determined by successive approximation $$T_{new} = T_{old} - J^{-1}(T_{old}) \cdot G(T_{old}), \tag{15}$$

where $$J_{i,j} \equiv \frac{\partial G_i}{\partial T_j}. \tag{16}$$

The second method is defined as simplex-based interpolation method.

This second method for numerical inversion of equations to determine $T_1$ and $T_2$ values requires a greater implementation effort, but provides accurate and robust results, that would be hardly obtained by the Newton-Raphson method, as well as lower computational costs.

The starting point is the S function, already used in Eq. 13:

$$S : \mathbb{R}^2 \to \mathbb{R}^2 \tag{17}$$

$$\begin{bmatrix} T_1 \\ T_2 \end{bmatrix} \to \begin{bmatrix} S_1 \\ S_2 \end{bmatrix}. \tag{18}$$

The plot for this function defines a 2-dimensional variety in a 4-dimensional space, which may be sampled by determining S over a rectangular grid $\hat{T}$ of the domain:

$$\{(\hat{T}_1^{i,j}, \hat{T}_2^{i,j}, S_1(\hat{T}^{i,j}), S_2(\hat{T}^{i,j})) | i=1, \ldots, n; j=1, \ldots, M\}. \tag{19}$$

Since an approximation of $S^{-1}$ is only needed to associate the signals of D1 and D2 images with the relaxometry values that determine them, the two-dimensional Delaunay triangulation $DT(\hat{S})$ is determined for the set of points $$\hat{S} = \{(S_1(\hat{T}^{i,j}), S_2(\hat{T}^{i,j}))\}. \tag{20}$$

The choice of this triangulation among the others is aimed at minimizing the difference in the internal angles of its triangles, due to the property of Delaunay triangulation that the circumcircles of the individual triangles contain no other vertices.

In relation to the above it has to be noted that the two dimensional surface on which the said points are located is a projection of a generic surface on an Euclidean two dimensional plane and the metric is therefore Euclidean so that the existence and the uniqueness of the Delauny triangulation is guaranteed.

Once $DT(\hat{S})$ has been obtained, the required approximation of $S^{-1}$ may be determined on the convex envelope of $\hat{S}$, by linear interpolation on the simplexes $\in DT(\hat{S})$, knowing that $$S^{-1}(\hat{S}) = \hat{T} \tag{21}$$

Once the maps $T_1^m$ and $T_2^m$ have been constructed, then a proton density map may be derived, by replacing the relaxation times $T_1^m$ and $T_2^m$ in Eqs. 2-3:

$$M_0^m = \frac{I_2}{\sin\alpha_2 \frac{1 - E_1(T_{R_2})}{p(T_{R_2}, \alpha_2)} \cdot [u_0(T_{R_2}, \alpha_2) - E_2(T_{R_2}) \cdot u_1(T_{R_2}, \alpha_2)] \cdot e^{-T_{E1}/T_2^m}} \tag{22}$$

$$= M_0 \cdot e^{-T_{E1}/T_2'} \tag{23}$$

where $$T_2' = \left\{ \frac{1}{T_2} - \frac{1}{T_2^*} \right\}^{-1} \tag{24}$$

Then, according to quantum theory of relaxation (Kelly S W & Sholl C A, "A relationship between nuclear spin relaxation in the laboratory and rotating frames for dipolar and quadrupolar relaxation," J. Phys. Condens. Matter 1992; 4:3317-3330), a map of $T_{2p}$ may be provided:

$$T_{2\rho}^m = 2\left\{\frac{1}{T_1^m} + \frac{1}{T_2^m}\right\}^{-1}. \quad (25)$$

As an additional step of the method of the present invention, optimization of acquisition parameters may be also carried out.

Figure 3:
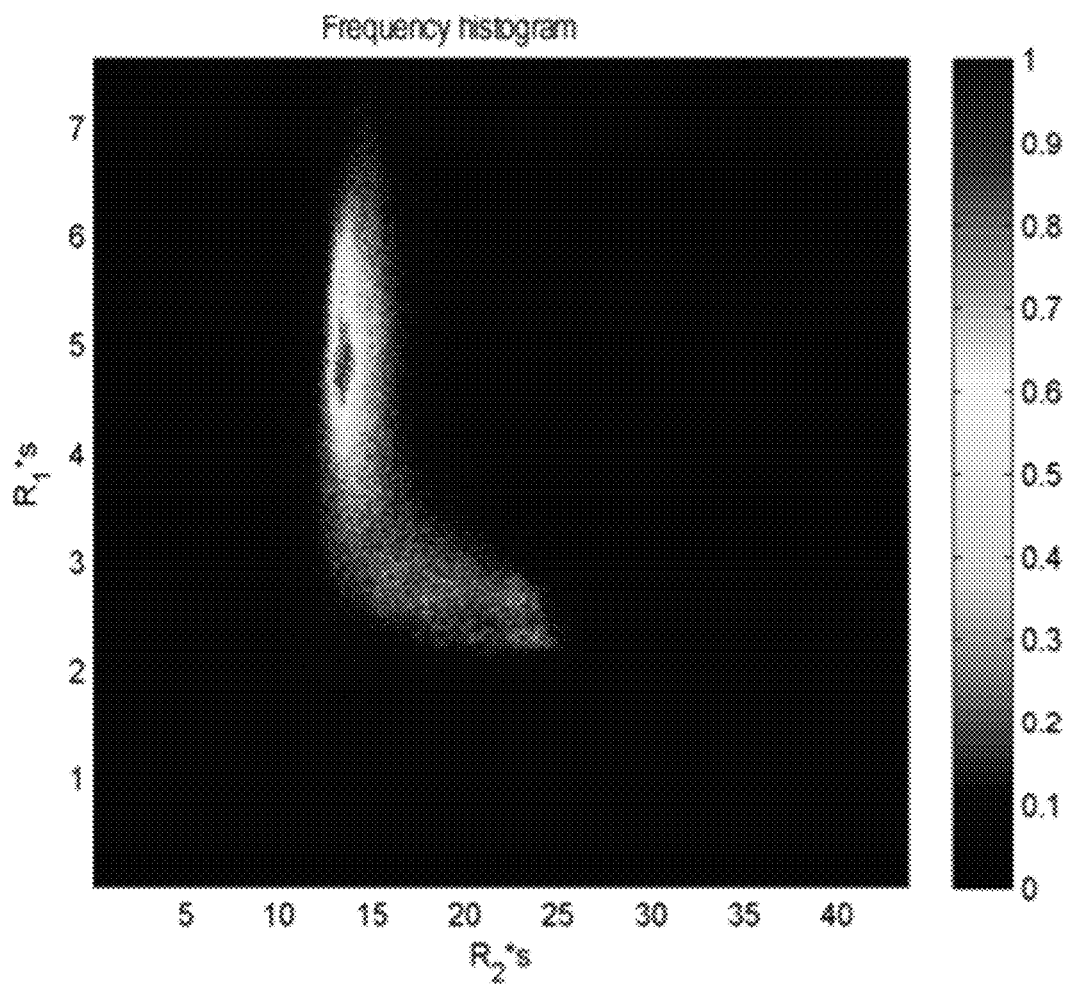
FIG. 3 shows an illustrative histogram for optimization of acquisition parameters.
Figure 4:
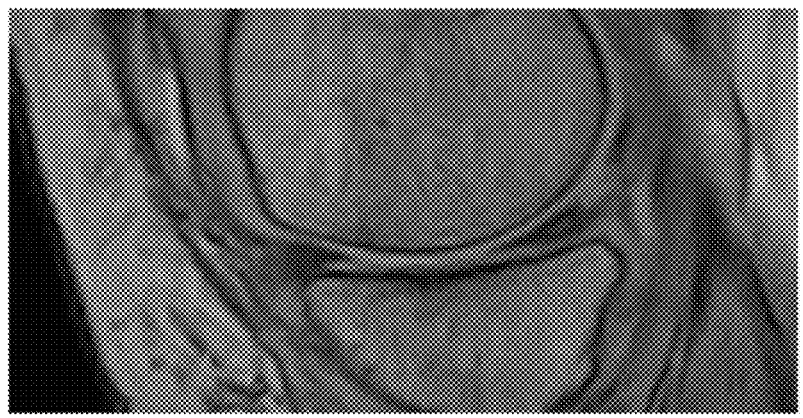
FIG. 4 shows a 3D Dual-Echo SSFP (Sham) negative image in the sagittal plane.
Figure 5:
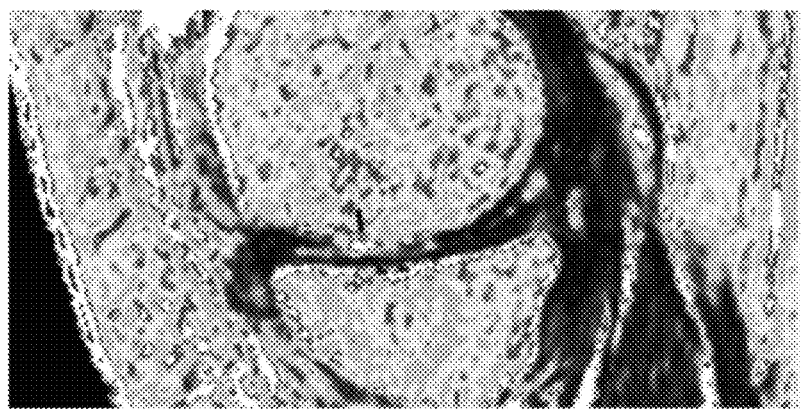
FIG. 5 shows a $T_2$ map of the same individual as in FIG. 1, where the arrow shows a focal alteration in the femoral cartilage.
Figure 6:
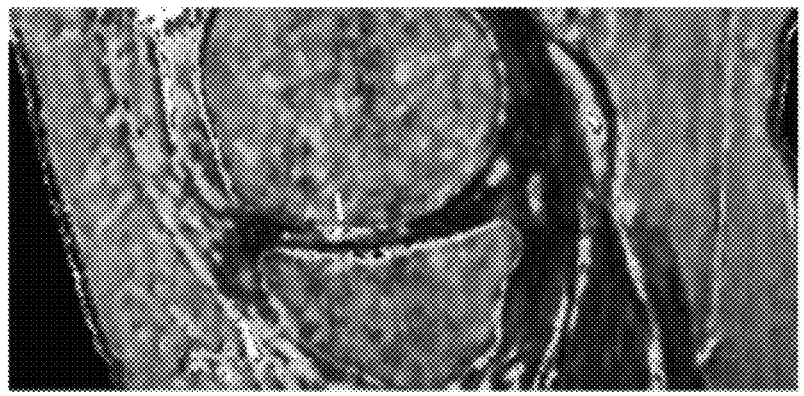
FIG. 6 shows the $T_{2p}$ map of the same individual as in FIG. 1, where the arrow shows a focal alteration in the femoral cartilage.
Figure 7:
FIG. 7 shows a 3D Dual-Echo SSFP (Sharc) image with no evidence of abnormality in the cartilage, with a slight hypointensity in the back of the femoral condyle.
Figure 8:
FIG. 8 shows the $T_2$ map of the same patient as in FIG. 7, in which a focal alteration of the femoral cartilage is shown (by an arrow), which alteration was not visible in the 3D Dual-Echo SSFP (Sharc) image.
Figure 9:
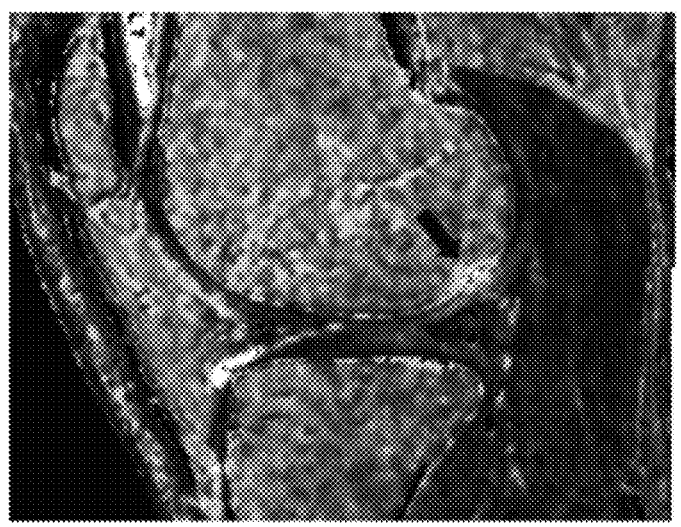
FIG. 9 shows the $T_{2p}$ map of the same patient as in FIGS. 7 and 8, in which a focal alteration of the femoral cartilage is shown (by an arrow), which alteration was not visible in the 3D Dual-Echo SSFP (Sharc), with a marked focal alteration being also shown for the signal of the adjacent bone marrow, as was also visible in the image of FIG. 8 and was not visible in that of FIG. 7.

Optimization of sequence acquisition parameters is performed using a combined histogram of actual distributions (which may be obtained, for instance, by acquisition of a non-optimized protocol) of relaxometry values in the relevant region (see for instance FIG. 3, which relates to the knee region in a 0.25 T magnet).

This is used to numerically calculate the average SNR obtained in the reconstructed relaxometry maps, as the acquisition parameters ($\alpha_{1,2}$, $TR_{1,2}$ and sampling bandwith) change.

This value is corrected to account for the number of additional excitations that a sequence having a shorter TR can afford, as compared with a sequence with a longer repetition time, and is finally maximized.

As a mere illustration of a possible result, with an ideal MRI system that can optimize the sampling times afforded by sequence timing, the histogram of FIG. 3 will lead to the following optimized acquisition parameters:
$\alpha_1 = 70°$
$T_{R1} = 21$ ms
$A_2 = 25°$;
$T_{R2} = 30$ ms;
$T_{E0} = 10$ ms.

If the following acquisition geometry is used:
FOVLET=200 mm (AP); RES=1 mm;
FOVCOD=200 mm (LL); RES=1 mm;
FOVSEL=120 mm (A); RES=2.5 mm;
then a total acquisition time of about 8 minutes is obtained.

FIGS. 4 to 9 show a few exemplary images obtained with the method of the present invention.

The figures show MRI images of the knee, obtained with the method of the present invention, using an Esaote G-Scan MRI apparatus—with a 0.25 T static field, and two optimized sequences of the type of the present invention. These images were acquired using the following parameters: FOV: 200×200×180 mm; Resolution: 1×1×2.5 mm³; total duration of the two acquisitions 12. Image reconstruction was performed using a zero-filling technique over a high-resolution image matrix (512×512 pixels).

Knowledge of the spin population of the eigenstates through the steps was used for numerical inversion, voxel-by-voxel of the corresponding signal equations, thereby providing quantitive values for proton density maps, and for $T_1$, $T_2$ relaxation time maps and $T_{2p}$ of the whole articulation.

Focal or diffuse cartilage alterations, as determined from the above mentioned relaxometry maps were compared with the abnormalities that were visible in normal images.

The figures clearly show that the proton density maps and relaxation time maps $T_1$, $T_2$ and $T_{2p}$ of the whole articulation, that were obtained using the method of the present invention provide evidence of cartilage or bone alterations that would not be otherwise visible in normal MRI images.

As already mentioned above, the present invention applies to both two-dimensional 2D and three-dimensional 3D images.

The invention claimed is:

1. A method of generating 2D or 3D maps of magnetic resonance imaging (MRI) $T_1$ and $T_2$ relaxation times comprising:

providing a MRI machine;
causing the MRI machine to acquire a 2D or 3D MRI a steady state free procession-free induction decay (SSFP-FID) sequence of a body part;
causing the MRI machine to acquire a dual-echo SSFP sequence of the body part;
reconstructing images from the SSFP-FID and dual-echo SSFP sequences;
extracting $T_1$ and $T_2$ relaxation times for each pixel or voxel of said images; and
generating a 2D or 3D map of the $T_1$ and $T_2$ relaxation times,
wherein $T_1$ is the longitudinal relaxation time and $T_2$ is the transverse relaxation time.

2. The method as claimed in claim 1,
wherein $T_2$ and $T_1$ maps are obtained assuming that the only physical parameters that affect signal formation are pure longitudinal ($T_1$) and transverse ($T_2$) relaxation times, Free Induction Decay time ($T_2^*$) and proton density, and
wherein diffusion, perfusion, chemical shift, magnetization transfer and other parameters independently affecting contrast are neglected and single-exponential relaxation is assumed for longitudinal and transverse components of a magnetic moment associated with each voxel.

3. The method as claimed in claim 1, wherein the $T_1$ and $T_2$ relaxation times are extracted for each pixel or voxel from the MRI signals received from acquisition of said images, through the steps of:
eliminating dependence on the $T_2^*$ parameter by generating quotients of the MRI signals for the first image acquired using the SSFP-FID sequence and those for the second image obtained from the first echoes of the Dual-Echo SSFP sequence, and the quotients of the signals for said third image and those for said second image, acquired from the second and first echoes of the Dual-Echo SSFP sequence respectively; and
determining the maps of the $T_1$ and $T_2$ relaxation times using numerical inversion methods.

4. The method as claimed in claim 1, wherein a Newton-Raphson inversion method 2D is used.

5. The method as claimed in claim 1, wherein simplex-based interpolation is used as an inversion method.

6. The method as claimed in claim 1, wherein a map of $T_2$ in a rotating frame ($T_{2p}$) parameters is determined according to values of the maps of $T_1$ and $T_2$ relaxation times.

7. The method as claimed in claim 1, further comprising the step of optimizing of acquisition parameters by an empirical process including:
making a chart with actual distributions of relaxation times in a predetermined region under examination;
determining a numerical signal-to-noise ratio value from the maps of $T_1$ and $T_2$ relaxation times so reconstructed as a function of variations of acquisition parameters for various flip angles, repetition times d and sampling band widths; and
maximizing the signal-to-noise ratio by using the parameters related thereto.

8. The method as claimed in claim 1, wherein a signal corresponding to zero-order unbalanced steady-state coherent magnetization of the first SSFP-FID sequence and for the first echo of the second Dual-Echo SSFP acquisition sequence is described by the following equation in which repetition time=$T_R$, echo time=$T_E$ and flip angle=$\alpha$:

$$S_0(T_R, \alpha, T_E) = \qquad (1)$$
$$M_0 \sin\alpha \cdot \frac{1 - E_1(T_R)}{p(T_R, \alpha)} \cdot [u_0(T_R, \alpha) - E_2(T_R) \cdot u_1(T_R, \alpha)] \cdot e^{-T_E/T_2^*}],$$

where:

$$E_1(T_R) = \exp(-T_R/T_1), \qquad (2)$$

$$E_2(T_R) = \exp(-T_R/T_2), \qquad (3)$$

$$u_0(T_R, \alpha) = \frac{p(T_R, \alpha)}{\sqrt{p^2(T_R, \alpha) - q^2(T_R, \alpha)}}, \qquad (4)$$

$$u_1(T_R, \alpha) = \frac{p(T_R, \alpha)}{q(T_R, \alpha)} \cdot [u_0(T_R, \alpha) - 1], \qquad (5)$$

$$p(T_R, \alpha) = 1 - E_1(T_R) \cdot \cos\alpha - E_2^2(T_R) \cdot [E_1(T_R) - \cos\alpha] \qquad (6)$$
and
$$q(T_r, \alpha) = E_2(T_R) \cdot [1 - E_1(T_R)] \cdot [1 + \cos\alpha], \qquad (7)$$

wherein the signal for the second echo of the Dual-Echo SSFP sequence is described by the following equation:

$$S_{-1}(T_R, \alpha, T_E) = \qquad (8)$$
$$M_0 \sin\alpha \cdot \frac{1 - E_1(T_R)}{p(T_R, \alpha)} \cdot \left[\frac{u_1(T_R, \alpha)}{E_2(T_R)} - u_0(T_R, \alpha)\right] \cdot e^{-(T_R - T_{E2})/T_2^*},$$

where: $T_{E0} = T_{E1} = T_{R2} T_{E2}$ and the $T_1$ and $T_2$ maps are obtained as follows:
assume the derived images $$D_1 = I_1/I_2 \qquad (9)$$

$$D_2 = I_3/I_2 \qquad (10)$$

where $I_1$, $I_2$ and $I_3$ are the images reconstructed from SSFP-FID, the first and second echoes of the Dual-Echo SSFP, respectively;
then the signals for the above signal images of the derived images $D_1$ and $D_2$ will be:

$$S_1 = \frac{\sin\alpha_1 \cdot \frac{1 - E_1(T_{R1})}{p(T_{R1}, \alpha_1)} \cdot [u_0(T_{R1}, \alpha_1) - E_2(T_{R1}) \cdot u_1(T_{R1}, \alpha_1)]}{\sin\alpha_2 \cdot \frac{1 - E_1(T_{R2})}{p(T_{R2}, \alpha_2)} \cdot [u_0(T_{R2}, \alpha_2) - E_2(T_{R2}) \cdot u_1(T_{R2}, \alpha_2)]} \qquad (11)$$

$$S_2 = \frac{\frac{u_1(T_{R2}, \alpha_2)}{E_2(T_{R2})} - u_0(T_{R2}, \alpha_2)}{u_0(T_{R2}, \alpha_2) - E_2(T_{R2}) \cdot u_1(T_{R2}, \alpha_2)}, \qquad (12)$$

where the dependence from $T_2^*$ and longitudinal magnetization $M_0$ was eliminated,
whereas said system of equations with two equations and two unknowns is solved to determine $T_1$ and $T_2$ relaxation times by numerical voxel-by-voxel inversion, performed for the signals related to each voxel.

9. The method as claimed in claim 8, wherein a $T_{2p}$ map is determined from $T_1^m$ and $T_2^m$ maps:

$$T_{2p}^m = 2\left\{\frac{1}{T_2^m} - \frac{1}{T_2^m}\right\}^{-1}. \qquad (25)$$

10. The method as claimed in claim 9, wherein a proton density map is determined from the $T_1^m$ and $T_2^m$ maps by replacing $T_1^m$ and $T_2^m$ relaxation times in Equations 2-3:

$$M_0^m = \frac{I_2}{\sin\alpha_2 \frac{1 - E_1(T_{R_2})}{p(T_{R_2}, \alpha_2)} \cdot [u_0(T_{R_2}, \alpha_2) - E_2(T_{R_2}) \cdot u_1(T_{R_2}, \alpha_2)] \cdot e^{-T_{E1}/T_2^m}} \qquad (22)$$

$$= M_0 \cdot e^{-T_{E1}/T_2'} \qquad (23)$$

where $$T_2' = \left\{\frac{1}{T_2} - \frac{1}{T_2^*}\right\}^{-1}. \qquad (24)$$

* * * * *